(12) United States Patent
Le et al.

(10) Patent No.: US 8,901,987 B1
(45) Date of Patent: Dec. 2, 2014

(54) UNIDIRECTIONAL OUTPUT STAGE WITH ISOLATED FEEDBACK

(71) Applicant: Texas Instruments Incorporated, Dallas, TX (US)

(72) Inventors: Jim Le, Fairview, TX (US); Harish Venkataraman, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/939,844

(22) Filed: Jul. 11, 2013

(51) Int. Cl.
*H03L 5/00* (2006.01)
*H03K 5/003* (2006.01)

(52) U.S. Cl.
CPC ...................................... *H03K 5/003* (2013.01)
USPC ................ 327/333; 327/108; 326/80; 326/86

(58) Field of Classification Search
CPC .............. H03K 19/017509; H03K 19/018507; H03K 19/018521
USPC ................. 327/108, 109, 333; 326/80–83, 86
See application file for complete search history.

(56) References Cited

U.S. PATENT DOCUMENTS

| | | | | |
|---|---|---|---|---|
| 3,736,522 A | * | 5/1973 | Padgett | 330/269 |
| 4,940,906 A | * | 7/1990 | Gulczynski | 327/108 |
| 8,129,962 B2 | * | 3/2012 | Xie et al. | 323/269 |
| 2007/0080738 A1 | * | 4/2007 | Tai | 327/439 |

* cited by examiner

*Primary Examiner* — William Hernandez
(74) *Attorney, Agent, or Firm* — John R. Pessetto; Frederick J. Telecky, Jr.

(57) ABSTRACT

A circuit includes an input stage configured to receive a regulated input signal and generate an input stage output signal in response to the regulated input signal. An isolation stage can be configured to pass the input stage output signal to a buffered output node. The isolation stage receives feedback from the buffered output node to deactivate the buffer input stage if transient voltages are generated at the buffered output node. An output stage can be configured to provide current to the buffered output node in response to the regulated input signal.

20 Claims, 5 Drawing Sheets

UNIDIRECTIONAL OUTPUT STAGE WITH ISOLATED FEEDBACK

TECHNICAL FIELD

This disclosure relates to output drive circuits, and more particularly to regulated output circuits that employ isolation feedback to regulate output voltage levels between bus circuits.

BACKGROUND

A regulated output circuit can be employed when a circuit communicates from a given bus and voltage source and attempts to communicate to a circuit having a different bus and voltage source. For example, a circuit on an "A" bus may utilize voltage levels of 0.9 volts to 5.5 volts. A circuit on bus "B" may operate with a supply in the range of 2.7 volts to 5.5 volts, for example. Since the circuits on bus A and B do not share a common power supply, some form of voltage level translation is necessary in order to communicate information between the respective busses. A regulated output circuit is one component of a translation circuit that enables voltage level translation between busses. A common application for using multiple busses is in a computer where multiple busses need to be isolated from one another in order to preserve parametric conditions on the respective busses (e.g., maintain maximum capacitive load for a given bus).

The typical means for coupling voltage, current, and ultimately information between busses is to regulate a desired voltage level such as a maintaining a voltage near ground (e.g., 0.5 v) on one side of the translation circuit. For example, a translation circuit that receives a voltage input from bus A and outputs voltage and current to bus B will attempt to maintain a low level condition such as 0.5 volts at all times when actively driving bus B. In order to communicate a low level signal (e.g., low logic signal) from bus A to bus B, the translation circuit enables a switch that switches a regulated output circuit to drive bus B to a low voltage level such as 0.5 volts. An error amplifier then receives feedback from the output in order to maintain or regulate the output voltage to the low level on bus B. If a high voltage level (e.g., logic 1) is to be communicated from bus A to bus B, then the translation circuit deactivates the switch operating bus B which is then pulled high by external pull-ups when the bus is not being driven. Thus, communicating from one voltage level to another is basically a sequence of driving the bus to a known low state when communicating one voltage state and releasing the bus to communicate the opposite voltage state. In repeater applications, static offsets are maintained as a valid low-level for every other component on the bus except the repeater. The requirement for bi-directional communication is that the static offset needs to allow for being externally over-driven without also interfering with the B-side bus.

Regulated output stages typically require finite time to recover when the output is forced out of regulation. Feedback from the output dictates that all internal nodes in the regulated output stage are saturated and thus, circuit recovery time is dependent on the slew rate of the amplifier circuit driving the output. This problem can be exacerbated in applications where unidirectional output stages are used to generate a static output low voltage (VOL) offset. The VOL regulation loop saturates when external circuits pull down on the bus, for example. When not actively driving the bus, an external pull-up resistor pulls the bus high as soon as the external pull-down circuit releases the bus. A "glitch" or transient can result on the bus as the VOL regulator slews to regain regulation, however. Some attempts to correct this problem include increasing bias current and reducing capacitive parasitic parameters but practical limitations exist due to desired response times for the regulated output stage. Another technique for reducing transients includes clamping methods applied at the regulated output, however clamping effectiveness is reduced when weaker output pull-down circuits are employed. Also, such clamping methods reduce available headroom for desired noise margins.

SUMMARY

This disclosure relates to regulated output circuits. In one example, a circuit includes an input stage configured to receive a regulated input signal and generate an input stage output signal in response to the regulated input signal. An isolation stage can be configured to pass the input stage output signal to a buffered output node. The isolation stage receives feedback from the buffered output node to deactivate the buffer input stage if transient voltages are generated at the buffered output node. An output stage can be configured to provide a current path for the buffered output node in response to the regulated input signal.

In another example, a circuit includes an input stage configured to receive a regulated input signal and generate an input stage output signal in response to the regulated input signal. An isolation stage can be configured to pass the input stage output signal to a buffered output node. The isolation stage receives feedback from the buffered output node to deactivate the buffer input stage if transient voltages are generated at the buffered output node. A clamp stage can be biased to a predetermined voltage clamp range. The clamp stage can be configured to modify the operation of the isolation stage when an external signal pulls down the buffered output node. An output stage can be configured to provide a current path for the buffered output node in response to the regulated input signal.

In yet another example, an integrated circuit includes an input stage configured to receive a regulated input signal and generate an input stage output signal in response to the regulated input signal. An isolation stage can be configured to pass the input stage output signal to a buffered output node. The isolation stage receives feedback from the buffered output node to deactivate the buffer input stage if transient voltages are generated at the buffered output node. An output stage can be configured to provide a current path for the buffered output node in response to the regulated input signal. A replica stage can be configured to mirror the voltage and current response of the buffer input stage, the isolation stage, and the buffer output stage, and to generate a feedback signal based on the voltage and current response. An error amplifier can be configured to generate the regulated input signal based on a reference signal and the feedback signal received from the replica stage.

DETAILED DESCRIPTION

A circuit is provided for generating a regulated output while mitigating transient voltages and currents. The circuit provides a unidirectional regulated feedback loop to recover quickly from a saturation condition which overcomes slew limitations of conventional regulated outputs. In one example, a source-follower output stage can be modified with current gain boosting to provide unidirectional drive. The local feedback of the output stage allows it to respond quickly to external load transients while a replica biasing configuration can be employed to provide voltage regulation outside of the circuit output node. With voltage feedback derived internally via replica biasing, the voltage and current feedback loops can be isolated and hence the voltage loop does not go into saturation when the output node is externally driven. Hence, faster and more robust recovery is provided over conventional slew rate control methods.

Figure 1:
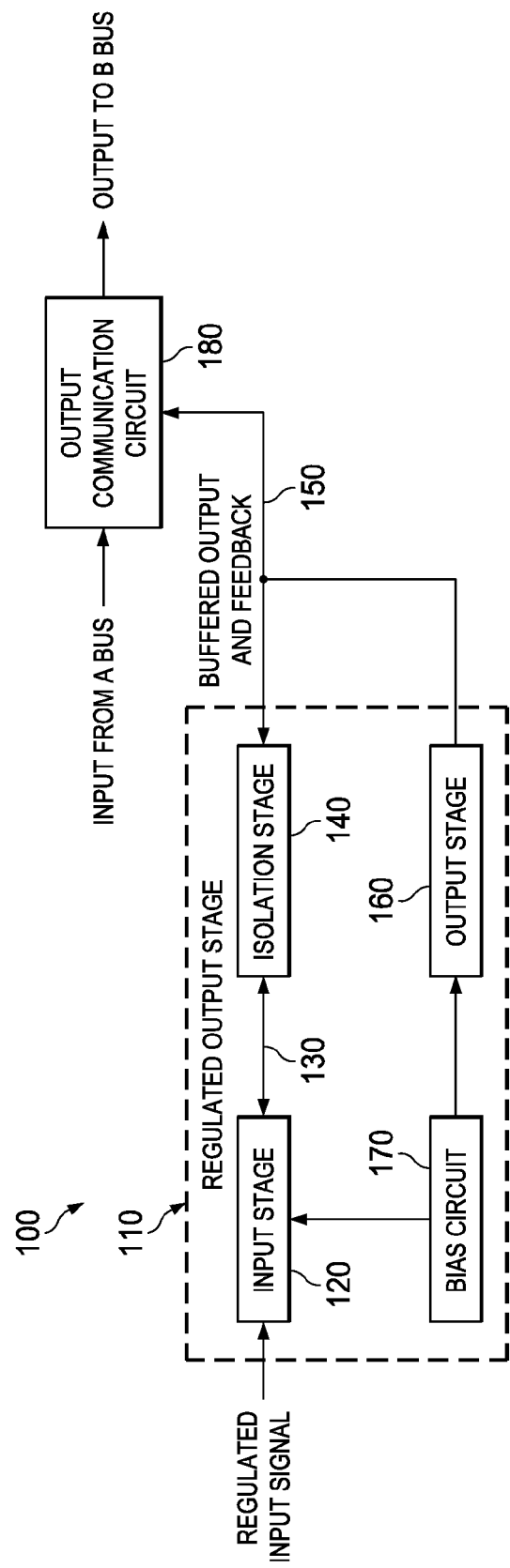
FIG. 1 illustrates an example of a circuit providing a regulated output that employs isolation feedback to mitigate transients.

FIG. 1 illustrates an example of a circuit 100 providing a regulated output that employs isolation feedback to mitigate transients. A regulated output stage 110 includes an input stage 120 that receives a regulated input signal and generates an input stage output signal 130 in response to the regulated input signal. The regulated input signal is typically a voltage supplied by an error amplifier (not shown) which will be illustrated and described below with respect to FIG. 4. The error amplifier typically generates a voltage as the regulated input signal (e.g., a substantially constant +0.5 volts). An isolation stage 140 passes the input stage output signal 130 to a buffered output node 150. In addition to passing the input stage output signal 130, the isolation stage receives feedback from the buffered output node 150 to deactivate the input stage 120 if transient voltages are generated at the buffered output node. In one example, the isolation stage 140 can be connected as a source follower to the input stage 120. In the direction toward the buffered output node 150, the source follower provides a minimal forward voltage drop such as from source-to-gate of a metal oxide semiconductor (e.g., MOS FET). In the opposite direction from the buffered output node 150 back toward the input stage 120, the isolation stage 150 can act as a switch which can isolate the input stage 120 from the buffered output node during transient conditions.

An output stage 160 provides a current path for the buffered output node 150 in response to the regulated input signal. A bias circuit 170 provides regulated bias currents and voltages to the input stage 120 and the output stage 160, respectively. Although not shown in FIG. 1, a separate copy of the regulated output stage 110 (e.g., duplicate circuits closely matched in silicon to regulated output stage) can be maintained and employed to provide voltage regulation feedback to the error amplifier which controls the regulated input signal. Such regulation method is referred to as replica biasing and is sampled outside the regulated output stage 110. Regulating the voltage control loop (e.g., to maintain the regulated input signal in view of a reference voltage) outside the regulated output stage 110 effectively isolates the buffered output node 150 from voltage saturation. As such, voltage saturation can be avoided in the regulated output stage 110 and transient performance improved over slew rate methods.

In one application example for the regulated output stage 110, an output communication circuit 180 can be employed to communicate an input (e.g., clock or data) from an A bus to an output at a B bus. The A bus and B bus operate according to differing voltage supplies and threshold levels. When attempting to communicate a low level signal for example from A to B, a switch can be activated in the communication circuit 180 which causes the buffered output 150 to drive bus B. For example, if the buffered output node 150 is regulated at 0.5 volts, then when activated by the communication circuit 180, Bus B can be driven to approximately 0.5 volts by the regulated output stage 110. To communicate the opposite state on bus B from bus A, the communication circuit 180 can deactivate the internal switch which removes the buffered output node 150 from driving Bus B. An external pull-up on Bus B (not shown) can then pull the floating bus to the opposite state for communications.

As will be illustrated and described below, various applications can be supported by the regulated output stage 100. The applications can include level translation between isolated busses as provided by the example circuit 180 and regulated output stage 110, bidirectional level translation between busses for repeaters (e.g., See FIG. 6), and priority networks (e.g., See FIG. 7), for example. Priority networks include having multiple output nodes connected at a common node and the device that has the lowest input reference voltage to drive the bus gains priority over the bus while disabling the other connected busses via the isolation stage 140 associated with the respective bus.

In one example, the circuit 100 can be provided as a circuit (e.g., integrated circuit, discrete circuit, combination of integrated circuit and discrete circuits) for providing a regulated output. Discrete control elements can be provided within the various circuits, for example, for controlling the buffered output node 150 and monitoring internal signals and/or feedback. The examples described herein can be provided via different analog and/or digital circuit implementations. For instance, in some cases, field effect transistors can be employed and in other cases junction transistors or diodes employed. All of the devices in the output stage 110 can be flipped (e.g., PMOS to NMOS or NMOS to PMOS, and so forth). Thus, the bus could have a common "pull-down" resistor (instead of a pull-up configuration as described herein) with the same circuit functionality as described herein.

Some components can be employed as discrete implementations such as a comparator comparing a reference signal to a control signal and in other examples, controllers operating via processor instructions and exchanging data via D/A and A/D converters could be employed to monitor feedback and generate control signals. The circuit 100 can employ various means of monitoring electrical parameters such as monitoring voltage and/or current. It can also employ a microcontroller or other control circuitry capable of digitizing these parameters, storing digital interpretations of these parameters in its memory, and associating acquired values in accordance with the circuit 100 operation. This includes performing logical and arithmetical operations with the acquired values, for example.

Figure 2:
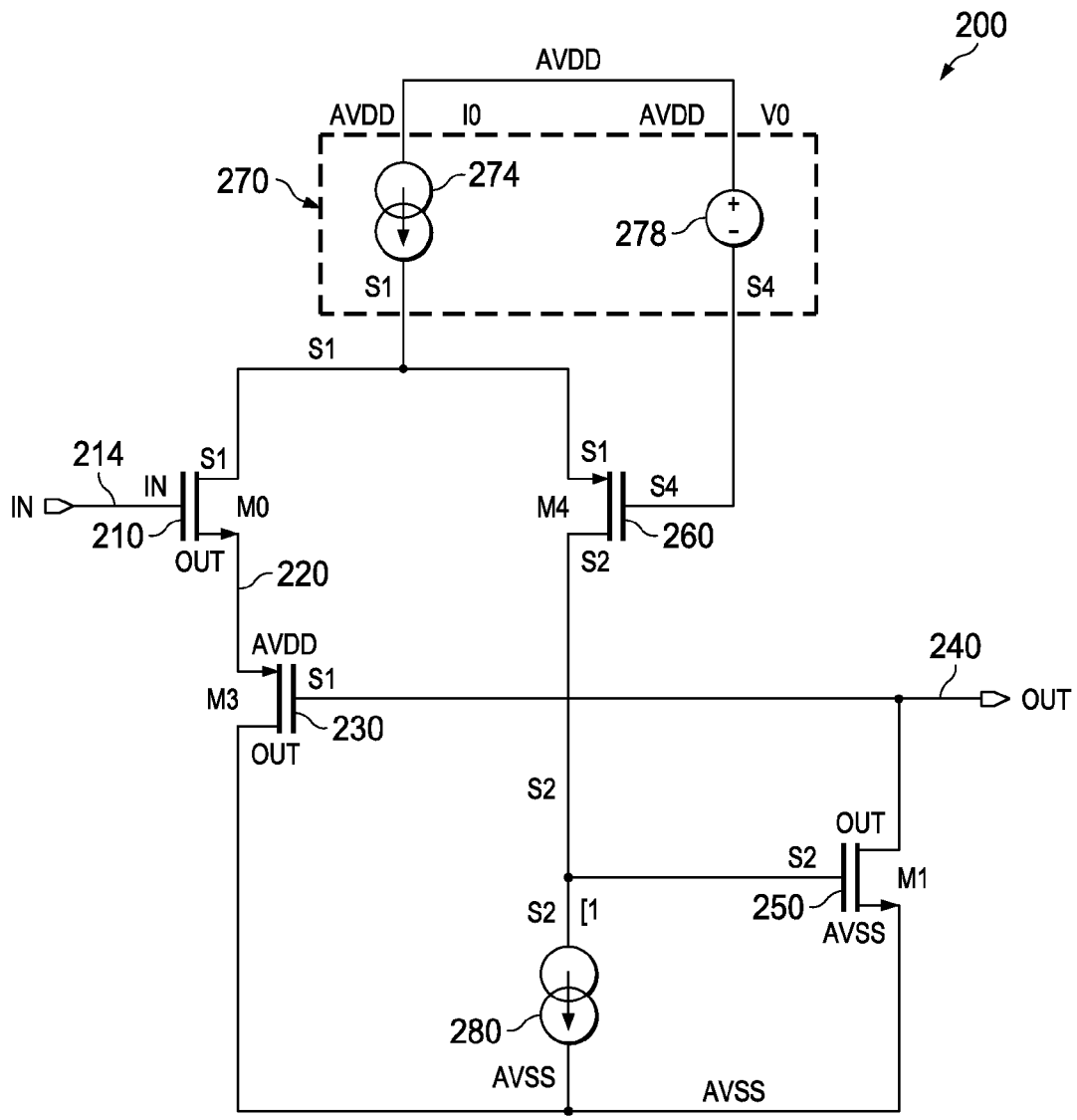
FIG. 2 illustrates a schematic example of a circuit providing a regulated output that employs isolation feedback to mitigate transients.

FIG. 2 illustrates a schematic example of a circuit 200 providing a regulated output that employs isolation feedback to mitigate transients. The circuit 200 is an example of the regulated output stage 110 depicted in FIG. 1. The circuit 200 includes a metal oxide semiconductor (MOS) transistor 210 that functions as an input stage which receives a regulated input 214 and generates an input stage output signal 220 in response to the regulated input signal. As used herein, the term transistor can include substantially any type of transistor including FET's and junction transistors, for example.

A transistor 230 functions as an isolation stage that passes the input stage output signal 220 to a buffered output node 240. In addition to passing the input stage output signal 220, the isolation stage transistor 230 receives feedback from the buffered output node 240 to deactivate the input stage transistor 210 if transient voltages are generated at the buffered output node. As shown, the isolation stage transistor 230 can be connected as a source follower to the input stage 210. In the direction toward the buffered output node 240, the transistor 230 acting as the source follower provides a minimal forward voltage drop such as from source-to-gate of the transistor. In the opposite direction from the buffered output node 240 back toward the input stage 210, the isolation stage transistor 230 can act as a switch which can isolate the input stage 214 input from the buffered output node 240 during transient conditions. An output stage transistor 250 provides a current path for the buffered output node 240 in response to the regulated input signal. The output stage transistor 250 is controlled by transistor 260 which is also part of the output stage depicted in FIG. 1. A bias circuit 270 provides regulated bias currents via source 274 and voltages via source 278 to the input stage transistor 210 and the output stage transistor 260, respectively. A current source 280 may also be included in the output stage.

As shown, the circuit 200 includes no pull-up capability which is in contrast to conventional circuits. Thus, a fast acting output stage can be provided that allows quick response to sudden load transients. With no pull-up capability, this allows the output stage to be driven low externally. Reduced input voltage dependency on output voltage/current facilitates use of replica biasing to indirectly regulate output. Replica biasing will be illustrated below with respect to FIG. 4. The output at node 240 is outside of voltage feedback loop. Thus, the voltage loop does not saturate with external pull-down configurations. Adding transistor 230 isolates the gate of input stage transistor 210 from the output 240. Source follower properties from input to output are preserved, but high output impedance looking back is also provided. Bias current of transistor 210 can be steered away from transistor 250. Load feedback is provided as mirrored copy of transistor 210 current. This allows using a copy of the output stage in the replica circuit which provides isolated load regulation. The isolation transistor 230 acts as additional source follower stage in current loop but shares bias current with transistor 210. Loop bandwidth is not significantly affected since larger bias currents are typically desired in the transistor 210 branch to maximize loop gain.

Figure 3:
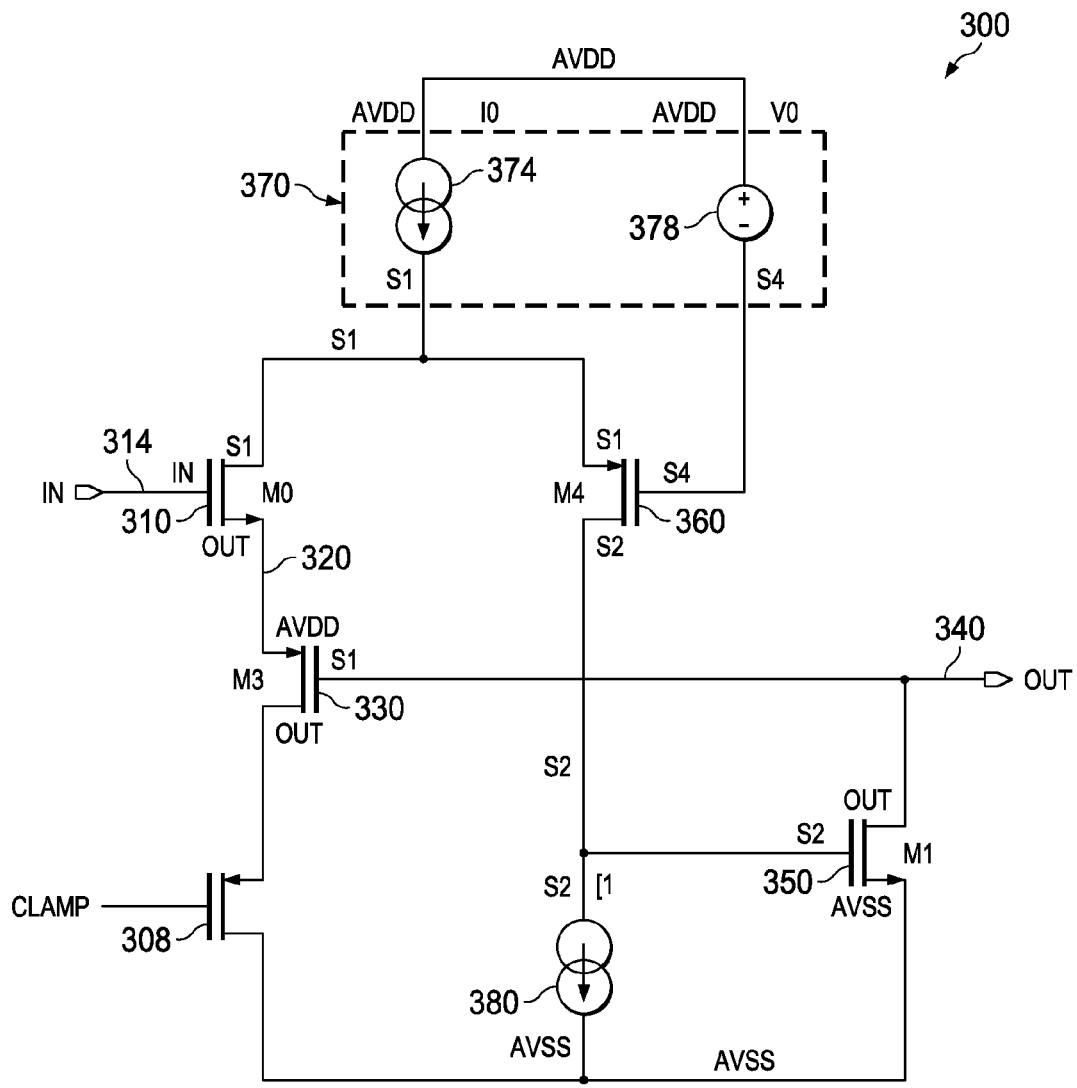
FIG. 3 illustrates a schematic example of an alternative circuit providing a regulated output that employs isolation feedback to mitigate transients.

FIG. 3 illustrates a schematic example of an alternative circuit 300 providing a regulated output that employs isolation feedback to mitigate transients. The circuit 300 is an example of the regulated output stage 200 depicted in FIG. 2. In this example, a clamp transistor 308 can be provided and is described in more detail below. Similar to the circuit 200 described above, the circuit 300 includes a metal oxide semiconductor (MOS) transistor 310 that functions as an input stage which receives a regulated input 314 and generates an input stage output signal 320 in response to the regulated input signal. A transistor 330 functions as an isolation stage that passes the input stage output signal 320 to a buffered output node 340. In addition to passing the input stage output signal 320, the isolation stage transistor 330 receives feedback from the buffered output node 340 to deactivate the input stage transistor 310 if transient voltages are generated at the buffered output node.

As shown, the isolation stage transistor 330 can be connected as a source follower to the input stage 310. In the direction toward the buffered output node 340, the transistor 330 acting as the source follower provides a minimal forward voltage drop such as from source-to-gate of the transistor. In the opposite direction from the buffered output node 340 back toward the input stage 310, the isolation stage transistor 330 can act as a switch which can isolate the input 314 from the buffered output node 340 during transient conditions. An output stage transistor 350 provides a current path for the buffered output node 340 in response to the regulated input signal. The output stage transistor 350 is controlled by transistor 360 which is also part of the output stage depicted in FIG. 1. A bias circuit 370 provides regulated bias currents via source 374 and voltages via source 378 to the input stage transistor 310 and the output stage transistor 360, respectively. A current source 380 may also be included in the output stage.

With respect to the clamp 308, the gate of the clamp can be biased as (VOUT-VDSAT of Transistor 330) or lower depending on desired clamp range. In standard operation where VOUT is being regulated at node 340, the clamp 308 does not interfere with operations of transistor 330. When the B-side bus is pulled down externally at node 340, the transistor 330 can be forced into triode mode and behave as a resistor, for example. At this point, clamp 308 essentially "substitutes" the functionality of transistor 330 in the output stage and allows the output stage to "see" a minimum of (VOUT-VDSAT of Transistor 330) even though the actual output may be lower. This simplifies the clamping method in the output stage since the local feedback loop is not completely saturated and it also can lower the bias current through the output stage during an external pull-down event since the transistor 310 and 330 branch may no longer demand extra current due to a larger VGS of transistor 310.

Figure 4:
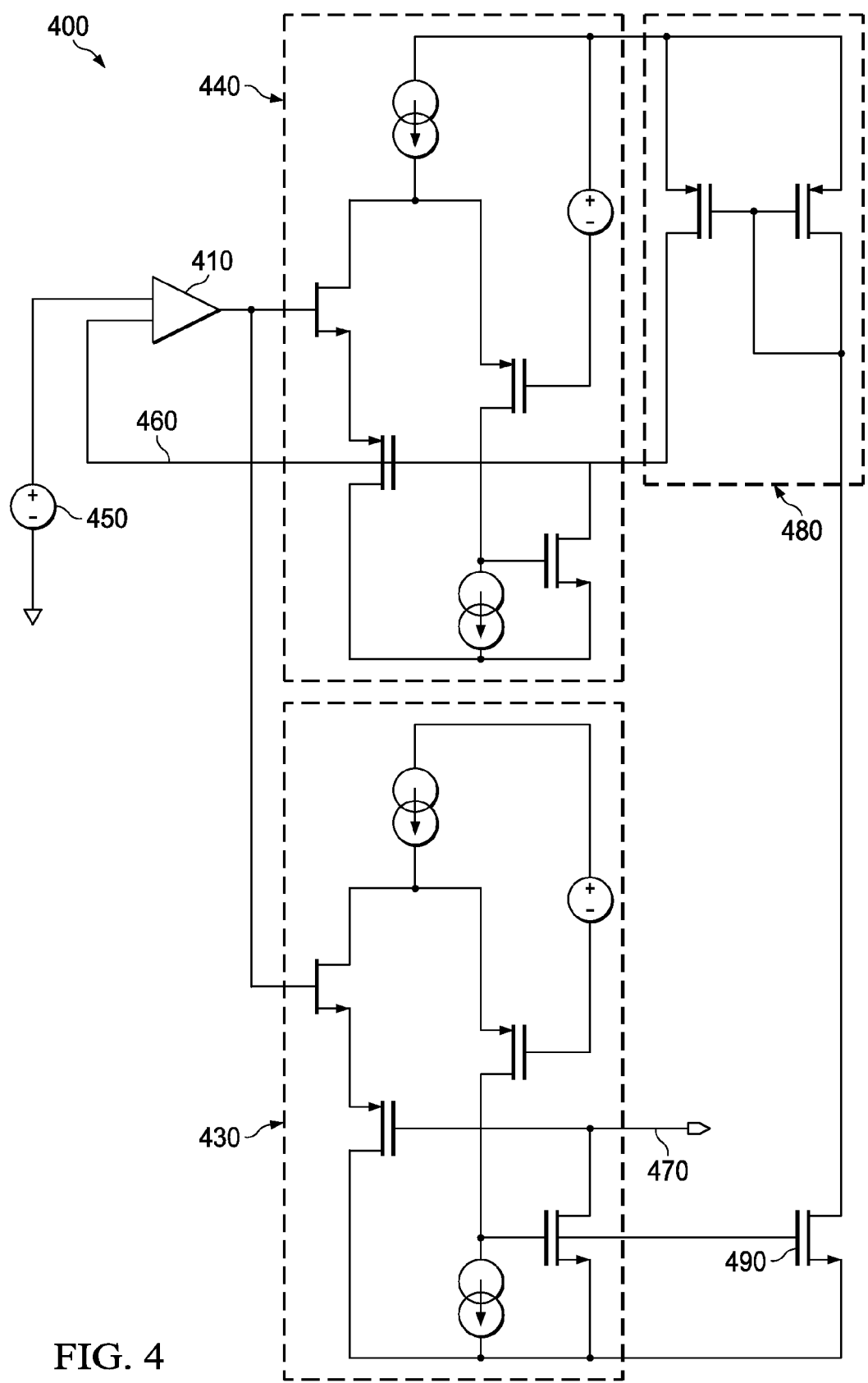
FIG. 4 illustrates an example of an error amplifier circuit that utilizes replica biasing to generate a regulated input signal for a regulated output circuit.

FIG. 4 illustrates an example of an error amplifier circuit 400 that utilizes replica biasing to generate a regulated input signal for a regulated output circuit. The circuit 400 includes an error amplifier 410 that generates a regulated output voltage 420 that is supplied to a regulated output stage 430 and replica stage 440. For purposes of brevity, each component of the stages 430 and 440 will not be described. Such description can be found at FIG. 2 and/or FIG. 4 which depict a regulated output stage that can be employed at stage 430 or 440. The replica stage 440 provides internal feedback to the error amplifier to regulate its output 420 in view of a reference voltage input 450 (e.g., 0.5 volt reference). The replica stage 440 mirrors the stage 430 in terms of voltage and current consumption since it can be fabricated in a similar area of a silicon wafer for example. The area can also be scaled down. Thus, a smaller area is desired since the load feedback stage can also be scaled downward. It is noted that the internal supply current can also be similarly scaled. As shown, feedback 460 from the replica stage is outside the buffered output node 470 of stage 430. This provides isolation from output saturation of stage 430. Transistor pair circuit 480 and transistor 490 provide current feedback from stage 430 to the feedback 460 from the replica stage 440.

The output stage 430 being outside of feedback loop prevents the loop from saturating due to external pull-down conditions at the output 470. This reduces the requirements on the error amplifier 410 since it no longer needs to filter transients. Regulation is thus achieved through a scaled internal replica shown at stage 440. This allows the output voltage at 470 to equal to replica output if components between stages are suitably matched.

Figure 5:
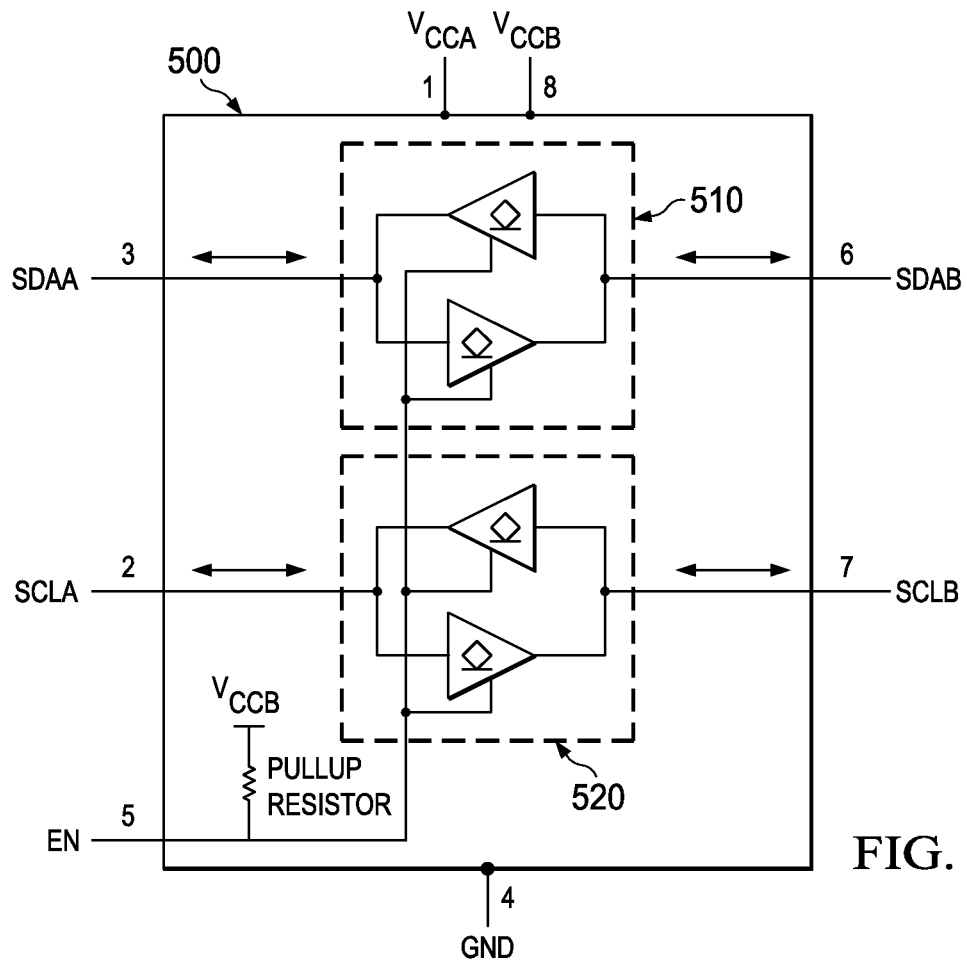
FIG. 5 illustrates an example circuit for bidirectional level translation utilizing a regulated output that employs isolation feedback to mitigate transients.

FIG. 5 illustrates an example circuit 500 for bidirectional level translation utilizing a regulated output that employs isolation feedback to mitigate transients. The circuit 500 includes bidirectional buffer pairs at 510 and 520. Such pairs could be used in a level translating repeater application, for example. Data signals can be communicated back and forth between an A side and a B side via an SDAA signal on the A side and an SDAB signal on the B side. Clock signals can be transmitted and/or received via SCLA signals on the A side and SCLB signals on the B side. An enable pin (EN) can be employed to enable or disable the circuit 500. Each buffer in the buffer pairs 510 and 520 can include the regulated output circuits depicted in FIG. 1, FIG. 2, FIG. 3, and/or FIG. 4.

Figure 6:
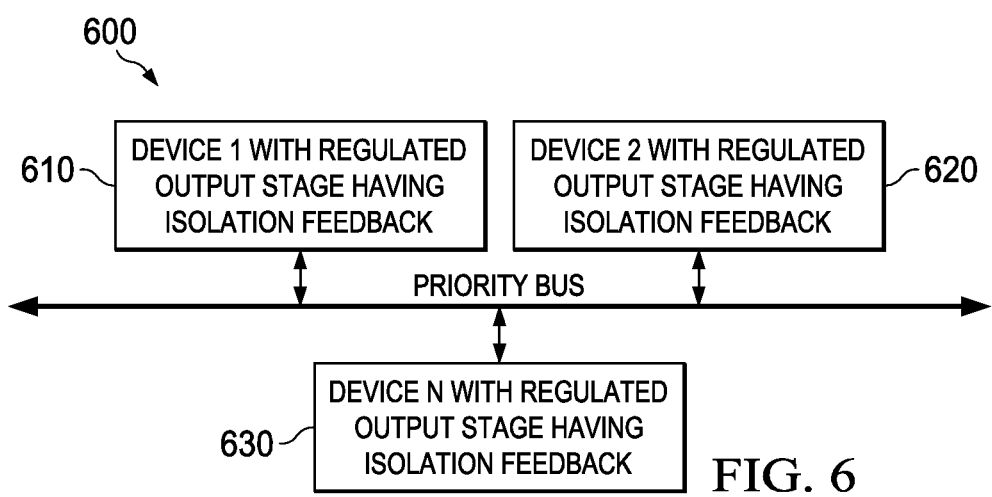
FIG. 6 illustrates an example circuit for a priority bus application utilizing a regulated output that employs isolation feedback to mitigate transients.

FIG. 6 illustrates an example circuit 600 for a priority bus application utilizing a regulated output that employs isolation feedback to mitigate transients. A priority bus is an application where the device the drives the bus the lowest takes control and disables other bus devices concurrently. In this example, devices 610 through 630 shown as devices 1 though N with N being a positive integer can be connected to the priority bus. Such connections can be made at the buffered output nodes previously described, for example. The unidirectional property of each output stage for each device 610 through 630 allows multiple output stages to be connected together at the priority bus. Analog outputs typically cannot be connected together unless all other outputs are high impedance state which is not the case for the regulated output circuits described herein. Thus, the output stage with lowest output signal has priority and "regulates" the bus while the other devices are disabled via the isolation feedback described above. Bandwidth of each individual voltage loop in a respective device can determine the frequency throughput of actual signals from input to output of each device. It is noted that the input to the output stage does not need to be static and thus, the priority can be dynamic.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   an input stage configured to receive a regulated input signal and generate an input stage output signal in response to the regulated input signal;
   an isolation stage configured to pass the input stage output signal to a buffered output node, wherein the isolation stage receives feedback from the buffered output node to deactivate the input stage if transient voltages are generated at the buffered output node; and
   an output stage configured to provide a current path for the buffered output node in response to the regulated input signal.

2. The circuit of claim 1, further comprising a bias circuit having at least one current source and at least one voltage source that provides regulated bias currents and voltages to the input stage and the output stage.

3. The circuit of claim 1, further comprising an output communication circuit to provide level translation between two isolated busses wherein the buffered output node drives one of the two isolated busses toward the regulated input signal in an active state and releases the bus in an opposite state from the active state.

4. The circuit of claim 3, wherein a pull-up drives the bus in the opposite state from the active state when the bus is released.

5. The circuit of claim 1, further comprising an error amplifier that generates the regulated input signal for the input stage based on a reference voltage.

6. The circuit of claim 5, further comprising a replica stage that mirrors voltage and current characteristics of the input stage, the output stage, and the isolation stage and provides feedback to the error amplifier to regulate the regulated input signal for the input stage in view of the reference voltage and the feedback.

7. The circuit of claim 6, further comprising a current feedback loop that supplies current from the output stage to the replica stage to facilitate regulation of the buffered output node.

8. The circuit of claim 1, further comprising a transistor clamp to modify operations of the isolation stage when an external component pulls-down the buffered output node.

9. The circuit of claim 1, wherein the input stage, the isolation stage, and the output stage are employed in a bidirectional level translator to communicate bidirectional data between isolated busses.

10. The circuit of claim 1, wherein the input stage, the isolation stage, and the output stage are employed to drive a priority bus where a device which drives the priority bus to a lowest potential receives priority while disabling other devices on the priority bus.

11. A circuit comprising:
    an input stage configured to receive a regulated input signal and generate an input stage output signal in response to the regulated input signal;
    an isolation stage configured to pass the input stage output signal to a buffered output node, wherein the isolation stage receives feedback from the buffered output node to deactivate the input stage if transient voltages are generated at the buffered output node;
    a clamp stage that is biased to a predetermined voltage clamp range, wherein the clamp stage is configured to modify the operation of the isolation stage when an external signal pulls down the buffered output node; and
    an output stage configured to provide a current path for the buffered output node in response to the regulated input signal.

12. The circuit of claim 11, further comprising a bias circuit having at least one current source and at least one voltage source that provides regulated bias currents and voltages to the input stage and the output stage.

13. The circuit of claim 11, further comprising an output communication circuit to provide level translation between two isolated busses wherein the buffered output node drives one of the two isolated busses toward the regulated input signal in an active state and releases the bus in an opposite state from the active state.

14. The circuit of claim 11, further comprising an error amplifier that generates the regulated input signal for the input stage based on a reference voltage.

15. The circuit of claim 14, further comprising a replica stage that mirrors voltage and current characteristics of the input stage, the output stage, and the isolation stage and provides feedback to the error amplifier to regulate the regulated input signal for the input stage in view of the reference voltage and the feedback.

16. The circuit of claim 15, further comprising a current feedback loop that supplies current from the output stage to the replica stage to facilitate regulation of the buffered output node.

17. An integrated circuit comprising:
   an input stage configured to receive a regulated input signal and generate an input stage output signal in response to the regulated input signal;
   an isolation stage configured to pass the input stage output signal to a buffered output node, wherein the isolation stage receives feedback from the buffered output node to deactivate the input stage if transient voltages are generated at the buffered output node;
   an output stage configured to provide a current path to the buffered output node in response to the regulated input signal;
   a replica stage configured to mirror the voltage and current response of the input stage, the isolation stage, and the buffer output stage, and to generate a feedback signal based on the voltage and current response; and
   an error amplifier configured to generate the regulated input signal based on a reference signal and the feedback signal received from the replica stage.

18. The integrated circuit of claim 17, further comprising a bias circuit having at least one current source and at least one voltage source that provides regulated bias currents and voltages to the input stage and the output stage.

19. The integrated circuit of claim 17, further comprising an output communication circuit to provide level translation between two isolated busses wherein the buffered output node drives one of the two isolated busses toward the regulated input signal in an active state and releases the bus in an opposite state from the active state.

20. The integrated circuit of claim 17, further comprising a transistor clamp to modify operations of the isolation stage when an external component pulls-down the buffered output node.

* * * * *